United States Patent [19]

Kawahara et al.

[11] Patent Number: 4,788,583

[45] Date of Patent: Nov. 29, 1988

[54] SEMICONDUCTOR DEVICE AND METHOD OF PRODUCING SEMICONDUCTOR DEVICE

[75] Inventors: Toshimi Kawahara, Kawasaki; Michio Sono, Yamato; Hiroaki Hayashi, Inagi, all of Japan

[73] Assignees: Fujitsu Limited, Kawasaki; Fujitsu Vlsi Limited, Kasugai, both of Japan

[21] Appl. No.: 77,292

[22] Filed: Jul. 24, 1987

[30] Foreign Application Priority Data

Jul. 25, 1986 [JP] Japan ................. 61-174854

[51] Int. Cl.⁴ ............ H01L 23/28; H01L 23/02; H01L 23/12; H02G 13/08
[52] U.S. Cl. ........................ 357/72; 357/70; 357/74; 174/52 PE
[58] Field of Search ............ 357/72, 70, 74; 174/52 PE

[56] References Cited

U.S. PATENT DOCUMENTS 3,778,685 12/1973 Kennedy .
3,902,148 8/1975 Drees et al. .
4,250,347 2/1981 Fierkens ................ 357/72

FOREIGN PATENT DOCUMENTS

| 27360 | 3/1977 | Japan | 357/72 |
| 88358 | 7/1980 | Japan | 357/72 |
| 93553 | 6/1982 | Japan | 357/72 |
| 110061 | 6/1983 | Japan | 357/72 |
| 58-161349 | 9/1983 | Japan . | |
| 58-191457 | 11/1983 | Japan . | |
| 58-197864 | 11/1983 | Japan . | |
| 181034 | 10/1984 | Japan | 357/72 |
| 60-46058 | 3/1985 | Japan . | |
| 144853 | 7/1986 | Japan | 357/72 |

OTHER PUBLICATIONS

Patent Abstracts of Japan, vol. 9, No. 173, Jul. 18, 1985 & JP-A-60 46 058.
Patent Abstracts of Japan, vol. 10, No. 32, Feb. 7, 1986 & JP-A-60 189 940.
Patent Abstracts of Japan, vol. 6, No. 264, Dec. 23, 1982 & JP-A-57 159 032.
Patent Abstracts of Japan, vol. 6, No. 185, Sept. 21, 1982 & JP-A-57 100 752.

*Primary Examiner*—Eugene R. LaRoche
*Assistant Examiner*—Michael B. Shingleton
*Attorney, Agent, or Firm*—Staas & Halsey

[57] ABSTRACT

A semiconductor device has such a construction that free tip ends of stage bars extending from a stage do not extend to side surfaces of a resin package, and the resin package is constituted by an inner resin package portion and an outer resin package portion. The free tip ends of the stage bars are located inside the outer resin package portion and are completely sealed. A method of producing the semiconductor device includes steps of providing wires for electrically connecting terminals of a semiconductor element which is mounted on the stage with corresponding leads and forming the inner resin package portion over the semiconductor element and its vicinity including portions of the leads and stage bars which are connected to the stage. Then the free tip ends of the stage bars are cut and the outer resin package portion is formed over the inner resin package portion and the remaining portion of the semiconductor device, so that the cut free tip ends of the stage bars are completely sealed inside the outer resin package portion.

16 Claims, 5 Drawing Sheets

SEMICONDUCTOR DEVICE AND METHOD OF PRODUCING SEMICONDUCTOR DEVICE

BACKGROUND OF THE INVENTION

The present invention generally relates to semiconductor devices and methods of producing semiconductor devices, and more particularly to a semiconductor device in which a semiconductor element is sealed by a resin package and a method of producing such a semiconductor device.

As will be described later in conjunction with drawings, a conventional semiconductor device comprises a stage, a semiconductor element mounted on the stage, a pair of stage bars extending from both sides of the stage for supporting the stage during the production process, leads, wires connecting terminals of the semiconductor element with the corresponding leads, and a generally flat parallelepiped resin package for sealing the semiconductor element and its surrounding parts.

The pair of stage bars extend up to respective side surfaces of the resin package. In other words, free tip ends of the stage bars are exposed at the respective side surfaces of the resin package. This is because the stage bars are essential to support the stage during the production process, and the excess length of the stage bars are cut along the side surfaces of the resin package only during one of the final production processes. However, since the free tip ends of the stage bars are exposed at the side surfaces of the resin package, external moisture can enter the semiconductor device from a gap formed between the resin package and the free tip ends of the stage bars. This moisture will enter inside the semiconductor device along the stage bars and will eventually reach the semiconductor element because the stage bars are connected to the stage which is mounted with the semiconductor element. When the moisture reaches the semiconductor element, the operation characteristic of the semiconductor device becomes deteriorated and causes breakdown of the semiconductor device.

Therefore, although the stage bars are essential in supporting the stage during the production process, there are problems in that the stage bars of the completed semiconductor device lead the external moisture to the semiconductor element and the conventional semiconductor device is insufficiently sealed against moisture.

Accordingly, various semiconductor devices have been proposed in which the stage bars are cut during the production process so that the free tip ends of the stage bars do not extend up to the side surfaces of the resin package. For example, in the semiconductor device proposed in a Japanese Laid-Open Patent Application No. 58-161349, a frame-shaped adhesive tape is adhered on the leads and the stage bars before the free tip ends of the stage bars are cut, so as to provide a support for the stage during the remaining production processes. In the semiconductor devices proposed in Japanese Laid-Open Patent Applications No. 58-191457 and No. 60-46058, an adhesive tape is adhered on each stage bar and the leads adjacent thereto before the free tip ends of the stage bars are cut, so as to provide a support for the stage during the remaining production processes.

Since the tip ends of the stage bars are not exposed at the side surfaces of the resin package, there is no possibility of the external moisture entering the semiconductor device from the side surfaces of the resin package. However, according to these previously proposed semiconductor devices using the adhesive tape, the adhesive tape remains inside the resin package of the completed semiconductor device. Generally, it is extremely difficult to obtain a satisfactory adhesion between the adhesive tape and the stage bars and the leads. For this reason, when the moisture enters from a gap formed between one of the leads and the resin package, the moisture is prevented from reaching the semiconductor element directly because the leads are not connected to the stage, but the moisture will advance along a gap formed between the lead and the adhesive tape adhered thereon, due to the poor adhesion therebetween. The moisture advancing along the gap between the lead and the adhesive tape will then reach a gap between the stage bar and the adhesive tape adhered thereon. As a result, the moisture will eventually reach the semiconductor element by way of the stage bar. Therefore, these previously proposed semiconductor devices are also insufficiently sealed against moisture.

On the other hand, in another semiconductor device proposed in Japanese Laid-Open Patent Application No. 58-197864, the free tip ends of the stage bars exposed at the side surfaces of the resin package are covered by a suitable material so as to prevent the external moisture from entering the semiconductor device from the side surfaces of the resin package where the free tip ends of the stage bars are exposed. However, it is difficult to find a suitable material that would satisfactorily adhere on the side surfaces of the resin package and provide a satisfactory seal. Furthermore, since the material covers only portions of the side surfaces of the resin package where the free tip ends of the stage bars are exposed, the sealing provided thereby against the external moisture is incomplete.

SUMMARY OF THE INVENTION

Accordingly, it is a general object of the present invention to provide a novel and useful semiconductor device and method of producing a semiconductor device in which the problems described heretofore are eliminated.

Another and more specific object of the present invention is to provide a semiconductor device in which free tip ends of stage bars extending from a stage do not extend to side surfaces of a resin package, and the resin package is constituted by an inner resin package portion and an outer resin package portion. The free tip ends of the stage bars are located inside the outer resin package portion and are completely sealed. According to the semiconductor device of the present invention, the external moisture is positively prevented from reaching a semiconductor element of the semiconductor device. In addition, since the stage bars are completely isolated from leads of the semiconductor device, the external moisture entering from a gap formed between the lead and the outer resin package is positively prevented from reaching the semiconductor element.

Still another object of the present invention is to provide a method of producing a semiconductor device comprising the steps of providing wires for electrically connecting terminals of a semiconductor element which is mounted on a stage with corresponding leads, forming an inner resin package portion over the semiconductor element and its vicinity including portions of the leads and stage bars which are connected to the stage, cutting free tip ends of the stage bars, and forming an outer resin package portion over the inner resin package portion and the remaining portion of the semiconductor device, so that the cut free tip ends of the stage bars are completely sealed inside the outer resin package portion. According to the method of the present invention, it is possible to produce the semiconductor device which is sealed against external moisture by simple steps. In addition, it is possible to use for the inner resin package portion a material which would not disturb or damage the wires as the material is injected during the molding of the inner resin package portion, because the materials used for the inner and outer resin package portions need not necessarily be the same.

Other objects and further features of the present invention will be apparent from the following detailed description when read in conjunction with the accompanying drawings.

BRIEF DESCRIPTION OF THE DRAWINGS

FIGS. 3A through 3C are cross sectional views and a plan view, FIGS. 4A and 4B are a plan view and a front view, FIG. 5 is a plan view.

DETAILED DESCRIPTION OF THE PREFERRED EMBODIMENTS

First, a description will be given of an example of the conventional semiconductor device by referring to FIGS.1A and 1B, so as to facilitate the understanding of the problems of the conventional semiconductor device.

Figure 1A:
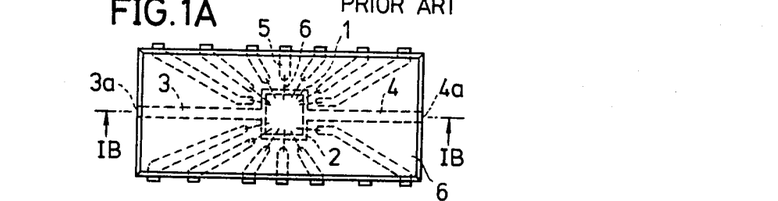
FIG. 1A is a plan view showing an example of a conventional semiconductor device.
Figure 1B:
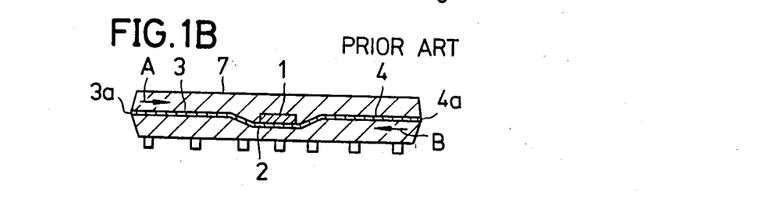
FIG. 1B is a cross sectional view of the conventional semiconductor device along a line IB—IB in FIG.1A.

In FIGS. 1A and 1B, a conventional semiconductor device comprises a semiconductor element 1 which is mounted on the stage 2, a pair of stage bars 3 and 4 extending from both sides of the stage 2 for supporting the stage 2 during the production process, leads 5, wires 6 connecting terminals of the semiconductor element 1 with the corresponding leads 5, and a generally flat parallelepiped resin package 7 for sealing the semiconductor element 1 and its surrounding parts.

The pair of stage bars 3 and 4 extend up to respective side surfaces of the resin package 7. In other words, free tip ends 3a and 4a of the stage bars 3 and 4 are exposed at the respective side surfaces of the resin package 7. This is because the stage bars 3 and 4 are essential to support the stage 2 during the production process, and the excess length of the stage bars 3 and 4 are cut along the side surfaces of the resin package 7 only during one of the final production processes. However, since the free tip ends 3a and 4a of the stage bars 3 and 4 are exposed at the side surfaces of the resin package 7, external moisture can enter the semiconductor device from a gap formed between the resin package 7 and the free tip ends 3a and 4a of the stage bars 3 and 4. This moisture will enter inside the semiconductor device along the stage bars 3 and 4 as respectively indicated by arrows A and B, and will eventually reach the semiconductor element 1 because the stage bars 3 and 4 are connected to the stage 2 which is mounted with the semiconductor element 1. When the moisture reaches the semiconductor element 1, the operation characteristic of the semiconductor device becomes deteriorated and causes breakdown of the semiconductor device.

Therefore, although the stage bars 3 and 4 are essential in supporting the stage 2 during the production process, there are problems in that the stage bars 3 and 4 of the completed semiconductor device lead the external moisture to the semiconductor element 1 and the conventional semiconductor device is insufficiently sealed against moisture.

Next, a descriptio will be given of a first embodiment of the semiconductor device according to the present invention by referring to FIGS.2A through 2C.

Figure 2A:
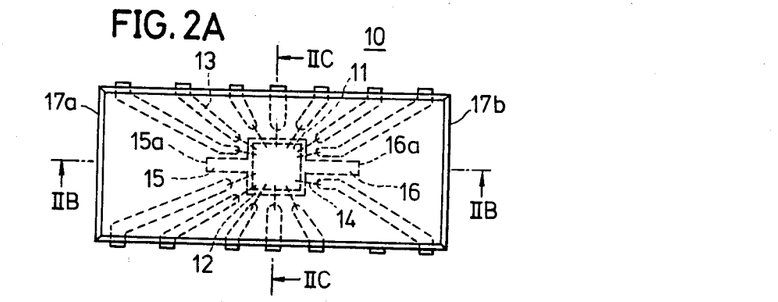
FIG. 2A is a plan view showing a first embodiment of the semiconductor device according to the present invention.
Figure 2B:
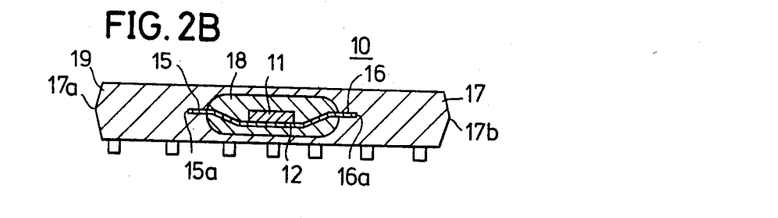
FIGS. 2B and 2C are cross sectional views of the first embodiment of the semiconductor device along lines IIB—IIB and IIC—IIC in FIG. 2A, respectively.
Figure 2C:
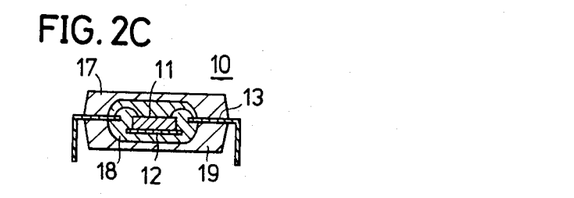

In FIGS. 2A through 2C, a semiconductor device 10 comprises a semiconductor element 11 which is mounted on a stage 12, leads 13, wires 14 connecting terminals of the semiconductor element 11 with the corresponding leads 13, a pair of stage bars 15 and 16 extending from both sides of the stage 12 for supporting the stage 12 during the production process, and a generally flat parallelepiped resin package 17 for sealing the semiconductor device 10. The resin package 17 comprises an inner resin package portion 18 and an outer resin package portion 19. The inner resin package portion 18 seals the semiconductor element 11 and its surrounding parts including portions of the stage 12, leads 13, the wires 14 and the stage bars 15 and 16. On the other hand, the outer resin package portion 19 seals the inner resin package portion 18 and the remaining portions of the semiconductor device 10 not sealed by the inner resin package portion 18.

The stage bars 15 and 16 do not extend up to respective side surfaces 17a and 17b of the resin package 17. In other words, free tip ends 15a and 16a of the stage bars 15 and 16 end inside the resin package 17. Therefore, the free tip ends 15a and 16a of the stage bars 15 and 16 are completely covered by the resin package 17 and the semiconductor device 10 is satisfactorily sealed against external moisture. The external moisture may enter from a gap formed between the resin package 17 and one of the leads 13, but the leads 13 are not connected to the stage 12. The moisture entering along the leads 13 may reach the semiconductor element 11 along the wires 14, however, the moisture reaching the semiconductor element 11 along the wires 14 is negligible compared to the moisture reaching the semiconductor element 11 along the stage bars 15 and 16 which are connected to the stage 12. In other words, because the leads 13 are isolated from the stage bars 15 and 16, the moisture entering along the leads 13 will not reach the semiconductor element 11 along the stage bars 15 and 16.

Next, a description will be given of a first embodiment of the method of producing the semiconductor device according to the present invention, by referring to FIGS. 3A, 3B, 3C, 4A, 4B, 5, 6A and 6B. In FIGS. 3A through 6B, those parts which are the same as those corresponding parts in FIGS. 2A through 2C are designated by the same reference numerals.

Figure 3A:
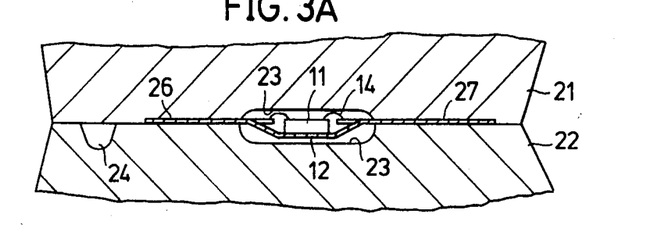
Figure 3B:
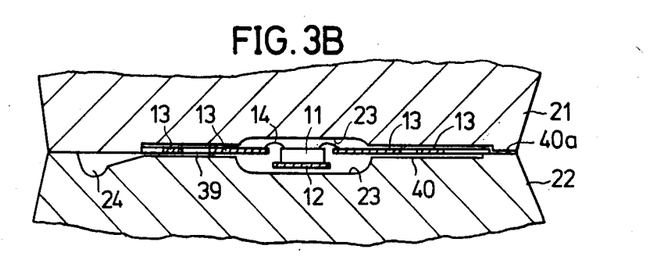
Figure 3C:
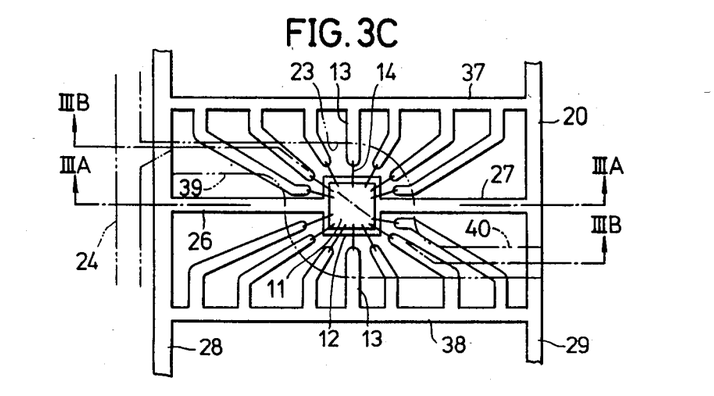

FIG. 3A shows a cross section along a line IIIA—IIIA in FIG. 3C, and FIG. 3B shows a cross section along a line IIIB—IIIB in FIG. 3C. In FIGS. 3A through 3C, a lead frame 20 integrally comprises the leads 13 which extend from frames 37 and 38 and a pair of stage bars 26 and 27 which support the stage 12 between frames 28 and 29 which constitute the lead frame 20 together with the frames 37 and 38. The semiconductor element 11 is mounted on the stage 12, and the wires 14 are then provided to connect the terminals of the semiconductor llement 11 to the corresponding leads 13. In this state, the lead frame 20 is sandwiched between upper and lower molds 21 and 22 as shown in FIGS. 3A and 3B. The lower mold 22 has a runner 24 for supplying a first resin which constitutes the inner resin package portion 18 described before.

Figure 4A:
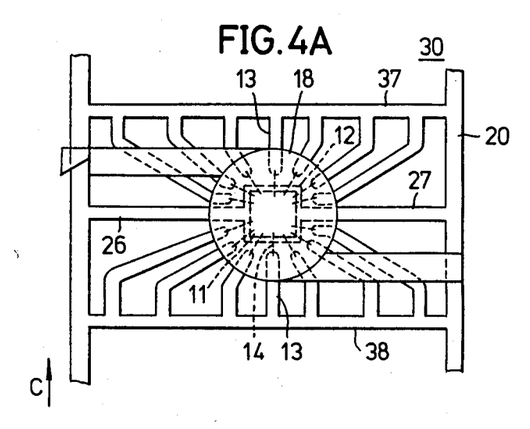
Figure 4B:
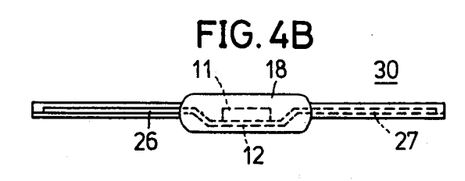

During a first molding process, the first resin from the runner 24 flows through a passage 39, a flat cavity 23 and a passage 40. The air is led out through a hole 40a. It is desirable that the flow of the first resin at the semiconductor element 11 is small so as not to damage the wires 14 and the semiconductor element 11. But on the other hand, it is desirable that the injected first resin properly fills the cavity 23. In the present embodiment, both of these conditions are satisfied because of the rounded shape of the cavity 23 and the passage 39 which supplies the first resin to the cavity 23 and the passage 40 which leads the air out of the molds 21 and 22 through the hole 40a. Since the first resin can freely flow between the leads 13 and between the lead 13 and the stage bar 26 or 27, both the top and bottom of the semiconductor element 11 and its surrounding parts are sealed by the inner resin package portion 18 when the first resin hardens as shown in FIGS. 4A and 4B. As shown in FIG. 3C, a connecting gate portion between the runner 24 and the passage 39 is narrowed at the frame 28 so as to facilitate the cutting of the first resin at a later stage of the process, but it is not essential that the connecting gate portion is narrowed. In order to prevent damage to the semiconductor device especially to the wires 14, a thermosetting resin is used for the first resin, for example.

FIGS. 4A and 4B show a semi-completed semiconductor device 30 which is obtained by the first molding process, and FIG. 4B shows the front view viewed in a direction C in FIG. 4A with the illustration of the frame 38 and the leads 13 omitted. As shown, the inner resin package portion 18 seals the semiconductor element 11, the stage 12, the wires 14, base portions of the stage bars 26 and 27 in the vicinity of the stage 12, and portions of the leads 13 in the vicinity of the semiconductor element 11.

Figure 5:
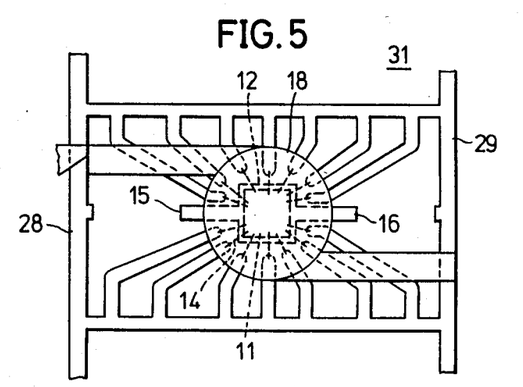

Next, portions of the stage bars 26 and 27 in the vicinity of the frames 28 and 29 are respectively cut off as shown in FIG. 5, and a semi-completed semiconductor device 31 is obtained. Even when these portions of the stage bars 26 and 27 are cut off, the stage 12 is still supported satisfactorily by the inner resin package portion 18 which supports the stage 12 via the leads 13 and the remaining stage bars 15 and 16.

Figure 6A:
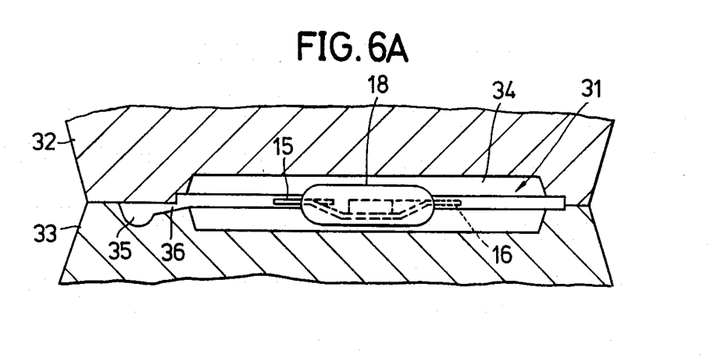
FIGS. 6A and 6B are a cross sectional view and a plan view for explaining a first embodiment of the method of producing the semiconductor device according to the present invention, respectively.

Thereafter, the outer resin package portion 19 is formed by a second molding process. The semi-completed semiconductor device 31 is sandwiched between upper and lower molds 32 and 33 as shown in FIG. 6A, and a second resin is injected into a generally flat parallelepiped flat cavity 34 from a runner 35 through a connecting gate portion 36. Then, the unwanted portions of the lead frame 20 and the like are cut off and removed. For example, a thermosetting resin is used for the second resin, and as will be described later, the second resin may either be the same as or different from the first resin.

Figure 6B:
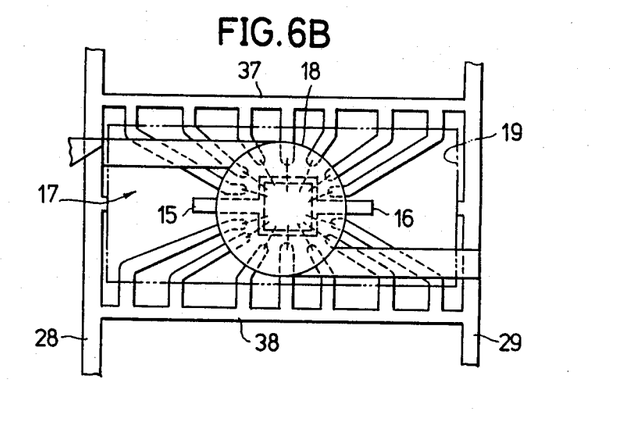

The cavity 34 is shaped so that the second resin covers the inner resin package portion 18 and the remaining portions of the semi-completed semiconductor device 31 which are not sealed by the inner resin package portion 18. As a result, the outer resin package portion 19 indicated by a two-dot chain line in FIG. 6B is formed when the second resin hardens. The inner and outer resin package portions 18 and 19 constitute the resin package 17.

For example, in the case where the same resin is used for the first and second resins, it is possible to use an epoxy resin heavily admixed with a filler to 75 to 90 weight percent, where the filler is silica powder having a coefficient of thermal expansion smaller than that of the epoxy resin itself, for example. When the epoxy resin is heavily admixed with the silica powder, the coefficient of thermal expansion thereof becomes extremely close to the coefficient of thermal expansion of the semiconductor element 11. This epoxy resin heavily admixed with the silica powder thus has a characteristic superior to that compared to the conventionally used resin from the point of view of thermal stress, and the sealing effect of the resin package 17 is superior compared to the resin package constituted by the conventional resin due to the high moisture resistance thereof. When the epoxy resin is heavily admixed with the silica powder, the flow property becomes poor and is unsuited for molding, but the inner resin package portion 18 can be formed without damaging the wires 14 because the cavity 23 is a small space surrounded by rounded surfaces as described before.

Other possible examples of the first and second resins are silicon resin, polyimide resin as a thermosetting resin or polyphenylene sulphide (PPS) resin, liquid crystal polymer (LCP) resin as a thermoplastic resin with a filler such as silica, silicon nitride, or alumina, 0 to 90 weight percent.

However, it is not essential that the same resin is used for the first and second resins. For example, it is possible to use for the first resin a thermosetting resin which has a low thermal stress so as to positively prevent undesirable effects on the semiconductor element 11 and its surroundings during the first molding process, and to use for the second resin a thermosetting resin which has a high moisture resistance. This thermosetting resin used for the second resin may have a poor flow rate since the semiconductor element 11, the wires 14 and the like are already sealed and protected by the inner resin package portion 18 when the outer resin package portion 19 is molded during the second molding process, and the selection of the resin which constitutes the resin package (that is, the outer resin package 19) is facilitated. In other words, it is possible to use a soft material for the first resin by placing emphasis on the prevention of damage to the wires 14 and the semiconductor element 11, and use another material for the second resin by placing emphasis on the moisture resistance.

In another example, the first resin is the thermoplastic resin and the second resin is the thermosetting resin. In this case, since the outer resin is the thermosetting resin, the package itself is heat-resistant in a solder mounting process on a printed circuit board.

Figure 7A:
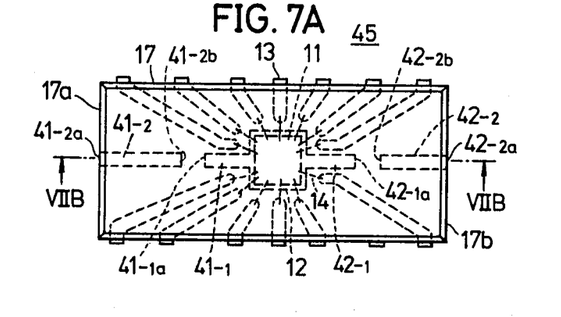
FIG. 7A is a plan view showing a second embodiment of the semiconductor device according to the present invention.
Figure 7B:
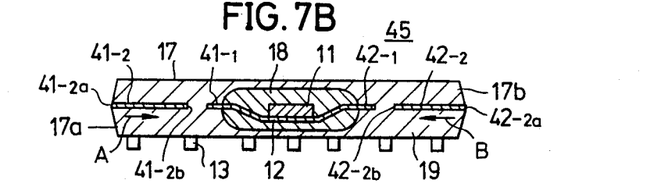
FIG. 7B is a cross sectional view showing the second embodiment of the semiconductor device along a line VIIB—VIIB in FIG. 7A.

Next, a description will be given of a second embodiment of the semiconductor device according to the present invention, by referring to FIGS. 7A and 7B. In FIGS. 7A and 7B, those parts which are the same as those corresponding parts in FIGS. 2A through 2C are designated by the same reference numerals, and a description thereof will be omitted. In a semiconductor device 45 shown in FIGS. 7A and 7B, intermediate portions of the stage bars 26 and 27 are cut off and removed during the production process. As a result, only stage bar portions 41-1 and 42-1 remain connected to the stage 12, and stage bar portions 41-2 and 42-2 remain near the respective side surfaces of the resin package 17. Tip ends 41-1a and 42-1a of the stage bar portions 41-1 and 42-1 are located inside the outer resin package portion 19. Outer tip ends 41-2a and 42-2a of the stage bar portions 41-2 and 42-2 are exposed at the side surfaces of the resin package 17, but inner ends 41-2b and 42-2b of the stage bar portions 41-2 and 42-2 are completely isolated from the tip ends 41-1a and 42-1a of the stage bar portions 41-1 and 42-1 by the outer resin package portion 19.

Therefore, even when the external moisture enters from a gap formed between the resin package 17 and the outer tip ends 41-2a and 42-2a of the stage bar portions 41-2 and 42-2 as indicated by arrows A and B in FIG. 7B, the moisture is stopped at the inner ends 41-2b and 42-2b of the stage bar portions 41-2 and 42-2. Hence, no moisture will reach the semiconductor element 11 along the remaining stage bar portions 41-1 and 42-1 which are connected to the stage 12, and the semiconductor device 45 is satisfactorily sealed against the external moisture.

Figure 8:
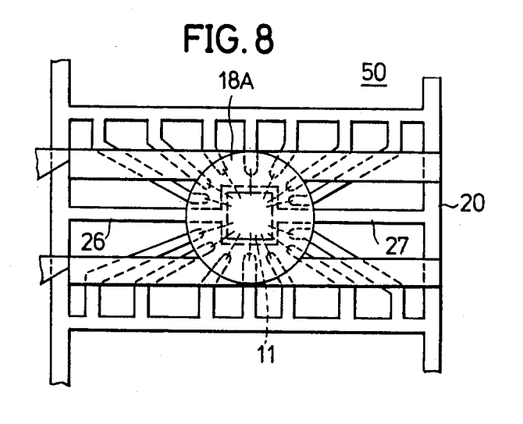
FIG. 8 is a plan view for explaining an essential part of a second embodiment of the method of producing the semiconductor device according to the present invention.

Next, a description will be given with respect to an essential part of a second embodiment of the method of producing the semiconductor device according to the present invention, by referring to FIG. 8. In the present embodiment, an inner resin package portion 18A is formed by use of suitable upper and lower molds (not shown) having passages which run along both sides of the stage bars 26 and 27. Otherwise, the production processes are the same as those of the first embodiment of the method described before. According to the present embodiment, the support of the stage 12 is stable when the stage bars 26 and 27 are cut.

Further, the present invention is not limited to these embodiments, but various variations and modifications may be made without departing from the scope of the present invention.

What is claimed is:

1. A semiconductor device comprising:
   a stage:
   a semiconductor element mounted on said stage, said semiconductor element having a plurality of terminals;
   a stage bar extending from said stage, said stage bar having a base end connected to said stage and a free tip end;
   a plurality of leads which are isolated from said stage and said stage bar;
   a plurality of wires connecting the terminals of said semiconductor element to corresponding ones of said leads; and
   a resin package for sealing at least said stage, said semiconductor element and said wires, said resin package comprising an inner resin package portion and an outer resin package portion,
   said inner resin package portion sealing said stage, said semiconductor element, said wires, and a portion of said stage bar and portions of said leads in a vicinity of said stage,
   said outer resin package portion sealing said inner resin package portion and portions of the remaining portions of said leads,
   said free tip end of said stage bar being located inside said outer resin package portion.

2. A semiconductor device as claimed in claim 1 wherein said inner resin package portion comprises a first portion having a generally flat rounded shape, said first portion sealing said stage, said semiconductor element, said wires, and a portion of said stage bar and portions of said leads in the vicinity of said stage.

3. A semiconductor device as claimed in claim 2 wherein said inner resin package portion further comprises at least one second portion extending from said first portion and covering portions of said leads, said second portion ending at a side surface of said inner resin package portion.

4. A semiconductor device as claimed in claim 1 wherein said inner and outer resin package portions are made of a thermosetting resin.

5. A semiconductor device as claimed in claim 1 wherein said inner and outer resin package portions are made of the same resin.

6. A semiconductor device as claimed in claim 1 wherein said inner and outer resin package portions are made of mutually different resins.

7. A semiconductor device as claimed in claim 1, wherein said inner resin package portion is made of a material having a coefficient of thermal expansion which is closer to the coefficient of thermal expansion of the semiconductor element than that of a material constituting said outer resin package portion.

8. A method of producing a semiconductor device comprising the steps of:
   mounting a semiconductor element on a stage, the stage being connected to a lead frame via a stage bar, the lead frame having a plurality of leads extending therefrom, portions of the leads in a vicinity of the stage being isolated from the stage and the stage bar;
   providing a plurality of wires connecting terminals of the semiconductor element to corresponding ones of the leads;
   molding an inner resin package portion over the stage, the semiconductor element, the wires, and a portion of the stage bar and portions of the leads in a vicinity of the stage;
   cutting at least a portion of the stage bar between the inner resin package portion and the lead frame;
   molding an outer resin package portion over the inner resin package portion, portions of the remaining portions of the leads and the exposed stage bar from the inner resin package portion, so that a free tip end of the stage bar extending from the stage is located inside the outer resin package portion; and
   cutting and removing unwanted portions of the lead frame.

9. A method of producing a semiconductor device as claimed in claim 8, wherein said step of molding the inner resin package portion comprises molding a first portion having generally flat rounded shape and sealing the stage, the semiconductor element, the wires, and a portion of the stage bar and portions of the leads in the vicinity of the stage.

10. A method of producing a semiconductor device as claimed in claim 9, wherein said step of molding said inner resin package portion further comprises simultaneously molding at least one second portion together with the first portion, the at least one second portion being connected to the first portion and covering portions of the leads, the at least one second portion and the first portion forming the inner resin package portion.

11. A method of producing a semiconductor device as claimed in claim 8, wherein said steps of molding the inner and outer resin package portions use a thermosetting resin.

12. A method of producing a semiconductor device as claimed in claim 8, wherein said steps of molding the inner and outer resin package portions use the same resin.

13. A method of producing a semiconductor device as claimed in claim 8, wherein said steps of molding the inner and outer resin package portions use mutually different resins.

14. A method of producing a semiconductor device as claimed in claim 8, wherein said steps of molding the inner and outer resin package portions use first and second resins, respectively, the first resin having a coefficient of thermal expansion which is closer to the coefficient of thermal expansion of the semiconductor element than the second resin.

15. A method of producing a semiconductor device comprising the steps of:
  mounting a semiconductor element on a stage, the semiconductor element having a plurality of wires extending therefrom, the stage being connected to a lead frame via a stage bar, the lead frame having a plurality of leads extending therefrom and respectively connected to the wires extending from the semiconductor element;
  forming an inner resin package portion over the stage, the semiconductor element, the wires, a portion of the stage bar, and portions of the leads adjacent to the wires;
  removing at least a portion of the stage bar between the inner resin package portion and the lead frame; and
  forming an outer resin package portion over the inner resin package portion, portions of the remaining exposed portions of the leads, and a free end tip of the stage bar extending from the inner resin package portion, so that the free tip end of the stage bar extending from the stage is located inside the outer resin package portion and isolated from the leads by the inner resin package portion and the outer resin package portion.

16. A semiconductor device comprising:
  a stage;
  a semiconductor element mounted on said stage;
  a stage bar extending from said stage, said stage bar having a base end connected to said stage and a free tip end;
  a plurality of wires extending from said semiconductor element;
  a plurality of leads respectively connected to said plurality of wires; and
  a resin package including:
    an inner resin package portion for sealing said stage, said semiconductor element, said wires, a portion of said stage bar, and portions of said leads adjacent said wires; and
    an outer resin package portion for sealing said inner resin package portion, portions of the remaining exposed portions of said leads, and said free tip end of said stage bar, said stage bar being isolated from said leads by said inner and outer resin package portions.

* * * * *